(12) United States Patent
Mendel et al.

(10) Patent No.: US 10,181,970 B2
(45) Date of Patent: *Jan. 15, 2019

(54) METHOD AND SYSTEM FOR CONTROLLING AN AMPLIFIER OF A COMMUNICATIONS DEVICE

(71) Applicant: NXP B.V., Eindhoven (NL)

(72) Inventors: Stefan Mendel, Graz (AT); Michael Pieber, Kumberg (AT)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/087,524

(22) Filed: Mar. 31, 2016

(65) Prior Publication Data

US 2017/0288916 A1 Oct. 5, 2017

(51) Int. Cl.
*H04L 25/03* (2006.01)
*H04B 17/318* (2015.01)
*H04L 25/02* (2006.01)

(52) U.S. Cl.
CPC ..... *H04L 25/03847* (2013.01); *H04B 17/318* (2015.01); *H04L 25/0262* (2013.01)

(58) Field of Classification Search
CPC .......... H04L 25/03847; H04L 25/0262; H04B 17/318
See application file for complete search history.

(56) References Cited

U.S. PATENT DOCUMENTS

| 7,072,632 | B2 * | 7/2006 | Astrachan | H04B 17/318 |
| | | | | 455/226.2 |
| 7,764,924 | B1 * | 7/2010 | Smithey | H04B 3/36 |
| | | | | 455/11.1 |
| 8,843,094 | B2 | 9/2014 | Ahmed et al. | |
| 9,814,005 | B2 | 11/2017 | Mendel et al. | |
| 2003/0026363 | A1 | 2/2003 | Stoter et al. | |
| 2004/0242174 | A1 * | 12/2004 | Kim | H03G 3/3052 |
| | | | | 455/136 |
| 2008/0273636 | A1 * | 11/2008 | Zhu | H03G 3/3078 |
| | | | | 375/345 |
| 2008/0293370 | A1 | 11/2008 | Wood | |
| 2010/0184397 | A1 | 7/2010 | Kadous et al. | |
| 2010/0189188 | A1 | 7/2010 | Li et al. | |
| 2013/0279621 | A1 * | 10/2013 | Yonge, III | H04W 74/0808 |
| | | | | 375/285 |
| 2015/0349901 | A1 * | 12/2015 | Tanaka | H04B 17/21 |
| | | | | 455/226.2 |

OTHER PUBLICATIONS

Extended European Search Report for Related Patent Appln. No. 17155125.2 (dated Sep. 19, 2017).
Extended European Search Report for Counterpart Patent Appln. No. 17155268.0 (dated Sep. 20, 2017).
Non-Final Office Action from Related U.S. Appl. No. 15/087,468 (dated Feb. 14, 2017).

* cited by examiner

*Primary Examiner* — Freshteh N Aghdam

(57) ABSTRACT

Embodiments of a method and a system controlling an amplifier of a communications device are disclosed. In an embodiment, a method for controlling an amplifier of a communications device involves checking for a data reception at the communications device and freezing a gain of the amplifier if the data reception is detected.

20 Claims, 15 Drawing Sheets

METHOD AND SYSTEM FOR CONTROLLING AN AMPLIFIER OF A COMMUNICATIONS DEVICE

CROSS REFERENCE TO RELATED APPLICATION

This application is related to the patent application entitled "Method and System for Processing a Radio Frequency (RF) Signal", filed on Mar. 31, 2016, having application Ser. No. 15/087,468, and later issued as U.S. Pat. No. 9,814,005 on Nov. 7, 2017.

BACKGROUND

RF communications devices typically need to support a wide dynamic range. For example, an RF communications device may need to cope with long distance communications with bad coupling conditions as well as close distance communications with good coupling conditions. In addition, RF communications devices typically use amplifiers for signal amplifying. However, changing the configuration of an amplifier during reception of a data frame can corrupt the data frame and result in data loss.

SUMMARY

Embodiments of a method and a system controlling an amplifier of a communications device are disclosed. In an embodiment, a method for controlling an amplifier of a communications device involves checking for a data reception at the communications device and freezing a gain of the amplifier if the data reception is detected.

In an embodiment, the method further comprises switching the gain of the amplifier between predefined gain values if no data reception is detected.

In an embodiment, checking for the data reception at the communications device comprises demodulating a digital signal that is derived from an RF signal received at the communications device and checking for the data reception at the communications device based on a result of demodulating the digital signal.

In an embodiment, demodulating the digital signal comprises generating a first signal with a fixed delay from an edge of the digital signal and generating a second signal that represents differences between consecutive samples of the digital signal.

In an embodiment, generating the second signal comprises calculating sample differences between the consecutive samples and normalizing the sample differences to generate the second signal.

In an embodiment, the consecutive samples comprise a first set of two consecutive samples and a second set of two consecutive samples. Calculating the sample differences between the consecutive samples comprises calculating a difference between a sum of the first set of two consecutive samples and a sum of the second set of two consecutive samples.

In an embodiment, checking for the data reception at the communications device comprises detecting a first edge of the second signal and detecting a second edge of the first signal in a time duration that the second signal has a particular state. Freezing the gain of the amplifier comprises freezing the gain of the amplifier in response to detecting the second edge of the first signal in the time duration that the second signal has the particular state.

In an embodiment, the method further comprises comparing a received signal strength indicator (RSSI) value of an RF signal received at the communications device with a threshold. Switching the gain of the amplifier comprises switching the gain of the amplifier if the RSSI value is larger than or smaller than the threshold.

In an embodiment, the RSSI value has a non-linear relationship with an amplitude of the RF signal.

In an embodiment, the method further comprises obtaining the RSSI value based on an amplitude of a quadrature component of the RF signal.

In an embodiment, a system for controlling an amplifier of a communications device includes a data reception detection device configured to check for a data reception at the communications device and a decision logic circuit configured to freeze a gain of the amplifier if the data reception is detected.

In an embodiment, the decision logic circuit is further configured to switch the gain of the amplifier between predefined gain values if no data reception is detected.

In an embodiment, the data reception detection device comprises a digital demodulator configured to demodulate a digital signal that is derived from an RF signal received at the communications device. The decision logic circuit is further configured to check for the data reception at the communications device based on a result of demodulating the digital signal.

In an embodiment, the digital demodulator is further configured to generate a first signal with a fixed delay from an edge of the digital signal and generate a second signal that represents differences between consecutive samples of the digital signal.

In an embodiment, the digital demodulator is further configured to calculate sample differences between the consecutive samples and normalize the sample differences to generate the second signal.

In an embodiment, the consecutive samples comprise a first set of two consecutive samples and a second set of two consecutive samples. The digital demodulator is further configured to calculate a difference between a sum of the first set of two consecutive samples and a sum of the second set of two consecutive samples.

In an embodiment, the digital demodulator is further configured to detect a first edge of the second signal and detect a second edge of the first signal in a time duration that the second signal has a particular state. The decision logic circuit is further configured to freeze the gain of the amplifier in response to detecting the second edge of the first signal in the time duration that the second signal has the particular state.

In an embodiment, the decision logic circuit is further configured to compare an RSSI value of an RF signal received at the communications device with a threshold and switch the gain of the amplifier if the RSSI value is larger than or smaller than the threshold.

In an embodiment, the system further comprises an RSSI device configured to obtain the RSSI value based on an amplitude of a quadrature component of the RF signal.

In an embodiment, a method for controlling an amplifier of a communications device involves checking for a data reception at the communications device. Checking for the data reception at the communications device involves generating a first signal with a fixed delay from an edge of the digital signal, generating a second signal that represents differences between consecutive samples of the digital signal, detecting a first edge of the second signal, and detecting a second edge of the first signal in a time duration that the second signal has a particular state. The method further involves freezing a gain of the amplifier in response to detecting the second edge of the first signal.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
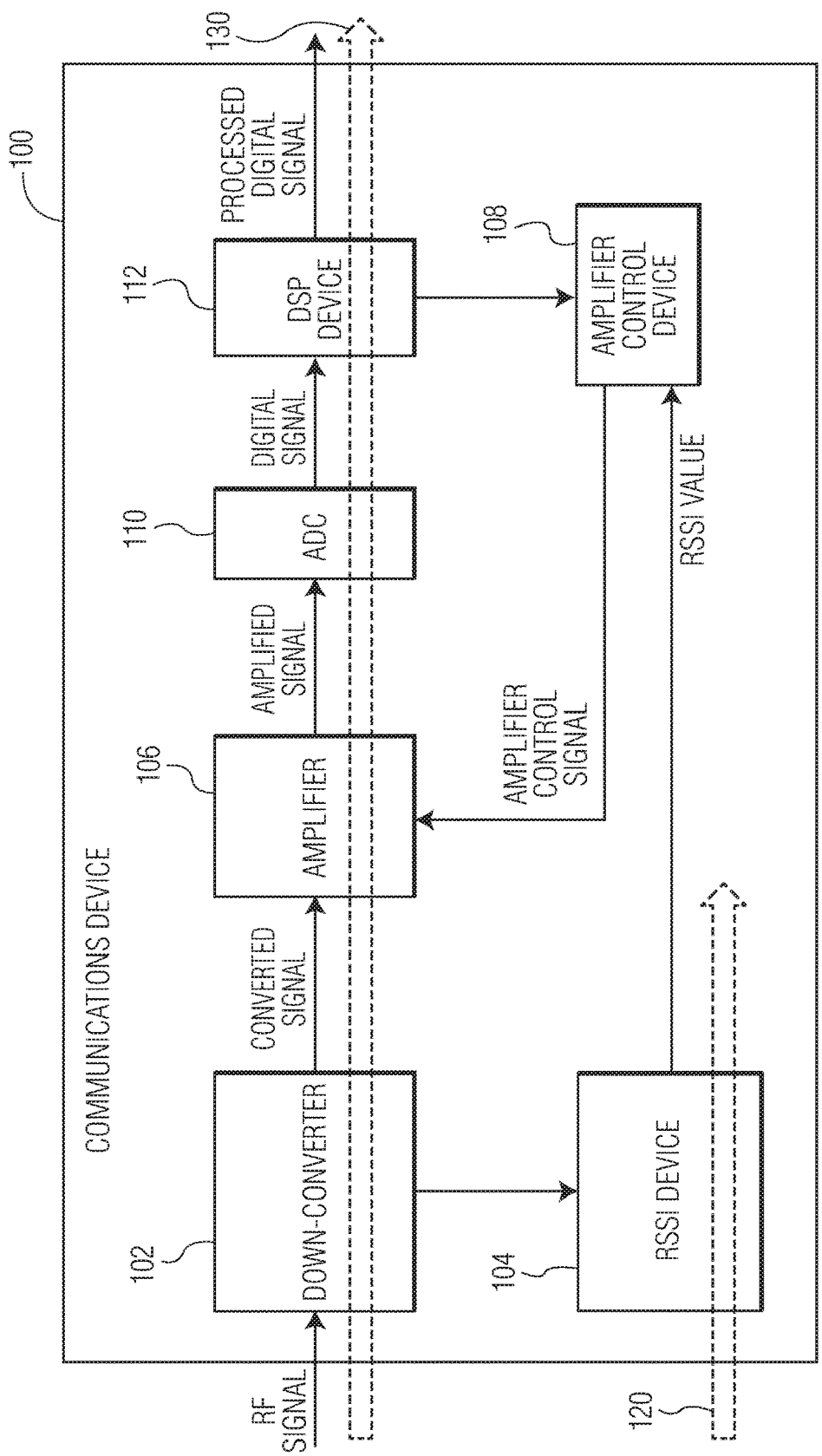
FIG. 1 depicts a communications device in accordance with an embodiment of the invention.

FIG. 1 depicts a communications device 100 in accordance with an embodiment of the invention. In the embodiment depicted in FIG. 1, the communications device includes a down-converter 102, a received signal strength indicator (RSSI) device 104, an amplifier 106, an amplifier control device 108, an analog-to-digital converter (ADC) 110, and a digital signal processing (DSP) device 112. The communications device is configured to process an RF signal to generate a digital signal. Although the illustrated communications device is shown with certain components and described with certain functionality herein, other embodiments of the communications device may include fewer or more components to implement the same, less, or more functionality. For example, in some embodiments, the communications device may include at least one antenna for the reception of RF signals. In another example, in some embodiments, the communications device may not include the ADC and/or the DSP device.

The communications device 100 depicted in FIG. 1 can adapt the amplifier gain of the amplifier 106 based on the signal strength of the received RF signal, which is measured by the RSSI device 104 in a signal channel 120 that is in parallel with the main signal channel 130 in the direction from the down-converter to the DSP device. For example, if the signal strength of the received RF signal is low (e.g., caused by large distance communications with bad coupling conditions), the communications device amplifies the received RF signal with a large amplifier gain. If the signal strength of the received RF signal is high (e.g., caused by close distance communications with good coupling conditions), the communications device amplifies the received RF signal with a small amplifier gain or attenuates the received RF signal. Compared to a communications device that has a static amplifier gain independent of the input RF signal strength, the communications device can adapt the amplifier gain of the amplifier based on the signal strength of the received RF signal. Consequently, the communications device can support a wide dynamic range (i.e., process RF with a wide range of amplitude).

The down-converter 102 of the communications device 100 is configured to convert an RF signal into a converted signal having a frequency that is lower than the frequency of the RF signal. The down-converter may be a mixer. In some embodiments, the down-converter is a baseband convert configured to convert the RF signal into a baseband signal.

The RSSI device 104 of the communications device 100 is configured to obtain an RSSI value based on an amplitude of the RF signal. In some embodiments, the RSSI device obtains the RSSI value based on an amplitude of a component of the RF signal. For example, the RSSI device obtains the RSSI value based on a DC value of a down-converted version of the RF signal. The RSSI value may be a number such as an integer. The amplitude of the RF signal may be a voltage of the RF signal and/or a current of the RF signal. In some embodiments, the RSSI value has a non-linear relationship with the amplitude of the RF signal. For example, an RSSI value of 30 may be associated with an amplitude of 1V while an RSSI value of 35 may be associated with an amplitude of 1.5 V.

The amplifier 106 of the communications device 100 is configured to amplify the converted signal based on the RSSI value to generate an amplified signal. In some embodiments, the amplifier is a baseband amplifier (BBA) configured to amplify a baseband signal produced by the down-converter 102 based on the RSSI value to generate an amplified signal.

The amplifier control device 108 of the communications device is configured to control the amplifier based on the RSSI value. In some embodiments, the amplifier control device is configured to control the gain of the amplifier based on the RSSI value and the amplifier is configured to amplify the converted signal according to the gain. In some embodiments, the amplifier control device is configured to switch the gain of the amplifier between multiple predefined gain values based on an RSSI value history (e.g., a current RSSI value and/or at least a previous RSSI value). In some embodiments, the amplifier control device is configured to compare the RSSI value with a threshold and switch the gain of the amplifier if the RSSI value is larger than or smaller than the threshold.

The ADC 110 of the communications device 100 is configured to convert the amplified signal into a digital signal. The DSP device 112 of the communications device is configured to process the digital signal to generate a processed digital signal. In some embodiments, the communications device does not include the ADC and/or the DSP device.

In an example operation of the communications device 100, the RSSI device 104 measures the signal strength of the RF signal before the start of data frame reception and the amplifier control device 108 sets the amplifier gain of the amplifier based on the measured signal strength of the RF signal before the start of data frame reception. During the data frame reception, the amplifier gain is kept constant (frozen) by the amplifier control device.

Figure 2:
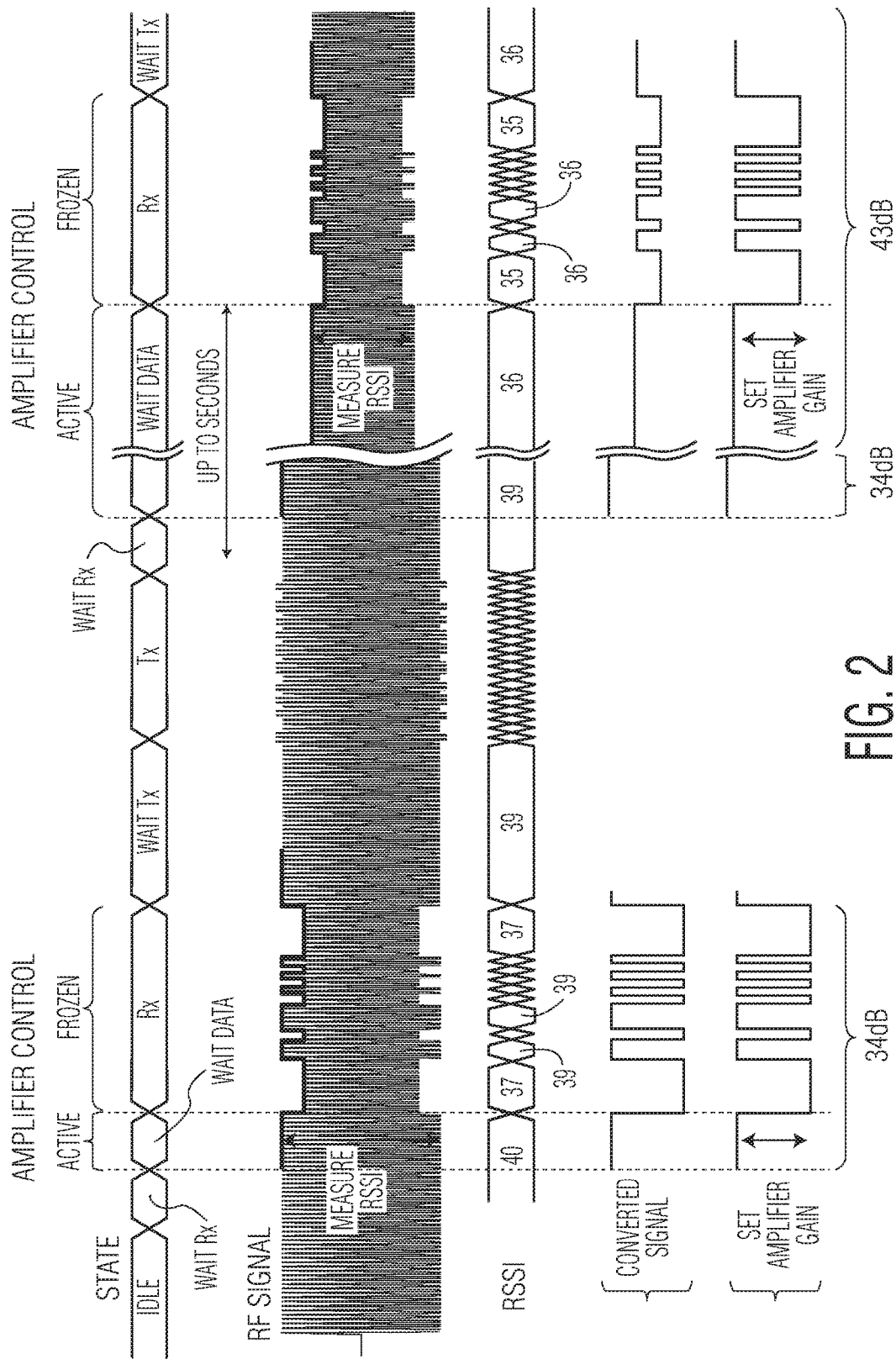
FIG. 2 illustrates a timing diagram of the communications device depicted in FIG. 1.

FIG. 2 illustrates a timing diagram of the communications device 100 depicted in FIG. 1. As illustrated in FIG. 2, the communications device has six different communications states, which include an IDLE state, a WaitRx state (the state before enabling the communications device), a WaitData state (the communications device being enabled and waiting for an incoming frame), a Rx state (the communications device actually receiving a data frame), a WaitTx state (the state before transmission starts), and a Tx state (the state where the communications state transmitting). In the embodiment depicted in FIG. 2, the RSSI device 104 of the communications device measures the signal strength of the received RF signal during the WaitData state and the amplifier control device 108 of the communications device sets the amplifier gain of the amplifier 106 based on the measured signal strength of the RF signal during the WaitData state. Compared to a communications scheme in which a static amplifier gain is determined during the IDLE state or the WaitRx state (which may be as long as 100 of milliseconds) and thus the RF signal may change significantly after the amplifier gain is set, the communications device depicted in FIG. 1 measures the signal strength of the RF signal right before the reception of the data frame. Consequently, the communications device depicted in FIG. 1 can set the amplifier gain based on the measured signal strength of the RF signal before the RF signal may change significantly.

Compared to a communications scheme that regularly changes the amplifier gain (also known as amplifier gain switching) during the reception of a data frame, thus corrupting the data frame, the communications device 100 depicted in FIG. 1 implements a hysteresis to change the amplifier gain of the amplifier 106 if the RSSI value has changed significantly. Consequently, the communications device depicted in FIG. 1 can reduce or minimize amplifier gain switching and decrease the possibility of interfering with the reception of a data frame. In some embodiments, the amplifier control device 108 keeps or freezes the gain of the amplifier 106 at a fixed value (thus disallowing amplifier gain switching) as soon as the communications device detects a potential data frame. The amplifier gain switching is suspended during reception of a data frame in order to avoid data frame corruption.

The amplifier control device 108 may control the gain of the amplifier 106 based on the RSSI value according to a hysteresis. In some embodiments, the amplifier control device is configured to set the gain of the amplifier based on a current RSSI value and/or at least a previous RSSI value. For example, the amplifier control device is configured to switch the gain of the amplifier between multiple predefined values based on a current RSSI value and/or at least a previous RSSI value. Because the amplifier gain is switched in view of historical RSSI data, undesirable amplifier switching at the boundary between different gain settings can be reduced or avoided.

Figure 3:
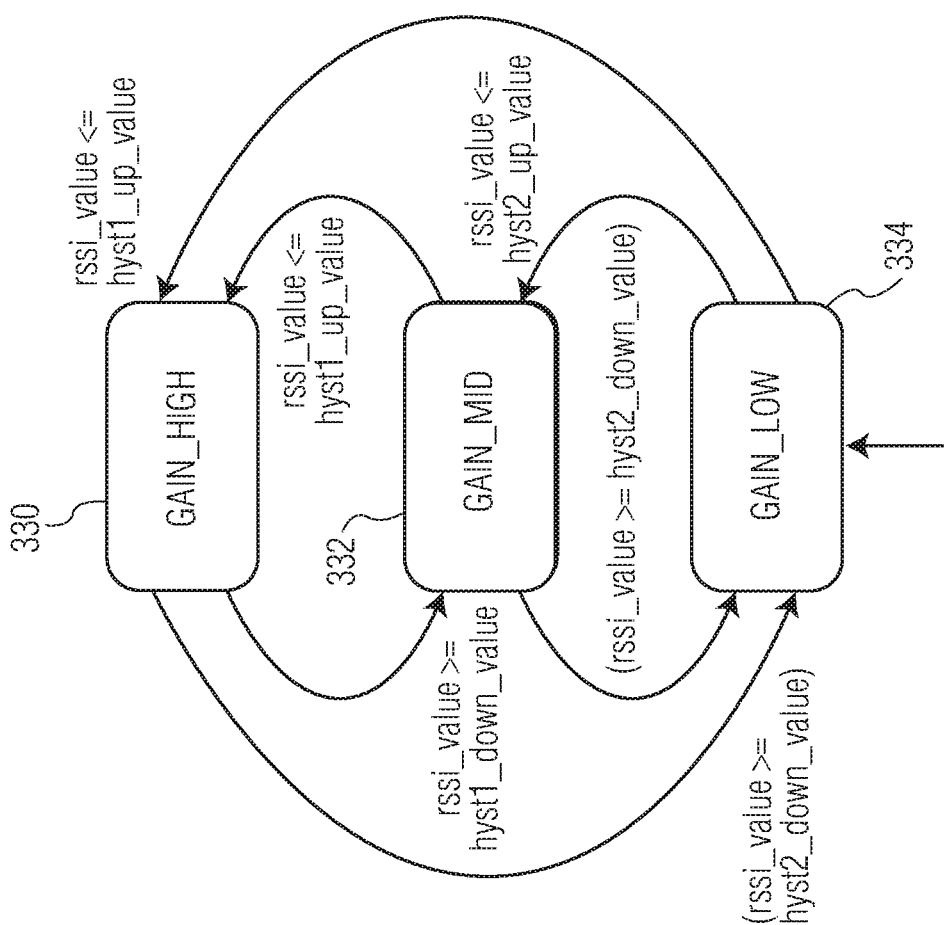
FIG. 3 illustrates a state machine diagram of an amplifier control device of the communications device depicted in FIG. 1.

FIG. 3 illustrates a state machine diagram of the amplifier control device 108 of the communications device 100 depicted in FIG. 1. In the state machine diagram of FIG. 3, a state machine of the amplifier control device has 3 states 330, 332, 334, specifying that the amplifier control device is configured to switch the amplifier gain between 3 different gain values. However, in other embodiments, the state machine of the amplifier control device has 2 states or more than 3 states and the amplifier gain is switched between 2 gain values or between more than 3 gain values.

In the state machine diagram of FIG. 3, the states 330, 332, 334, "GAIN_HIGH," "GAIN_MID," "GAIN_LOW" represent high, medium, low amplifier gain values. When the amplifier control device 108 is at the state of " GAIN_HIGH," the amplifier control device sets the BBA_gain to a high value, when the amplifier control device is at the state of "GAIN_MID," the amplifier control device sets the amplifier gain to a medium value, and when the amplifier control device is at the state of "GAIN_LOW," the amplifier control device sets the amplifier gain to a low value. Each of the 3 state machine states can be switched to another state machine state in response to a current RSSI value and/or a previous RSSI value. When the amplifier control device is at the state of "GAIN_HIGH," and the current RSSI value is larger than or equal to a threshold value, "hyst1_down_value," the amplifier control device is switched to the state of "GAIN_MID." When the amplifier control device is at the state of "GAIN_HIGH," and the current RSSI value is larger than or equal to a threshold value, "hyst2_down_value," the amplifier control device is switched to the state of "GAIN_MID." When the amplifier control device is at the state of "GAIN_MID," and the current RSSI value is smaller than or equal to a threshold value, "hyst1_up_value," the amplifier control device is switched to the state of "GAIN_HIGH." When the amplifier control device is at the state of "GAIN_MID," and the current RSSI value is larger than or equal to a threshold value, "hyst2_down_value," the amplifier control device is switched to the state of "GAIN_LOW." When the amplifier control device is at the state of "GAIN_LOW," and the current RSSI value is smaller than or equal to a threshold value, "hyst1_up_value," the amplifier control device is switched to the state of "GAIN_HIGH." When the amplifier control device is at the state of "GAIN_LOW," and the current RSSI value is smaller than or equal to a threshold value, "hyst2_up_value," the amplifier control device is switched to the state of "GAIN_MID." In some embodiments, a control or enablement signal is used to enable or disable the switching between the states of the amplifier control device. In some embodiments, the state of the amplifier control device can be reset.

Figure 4:
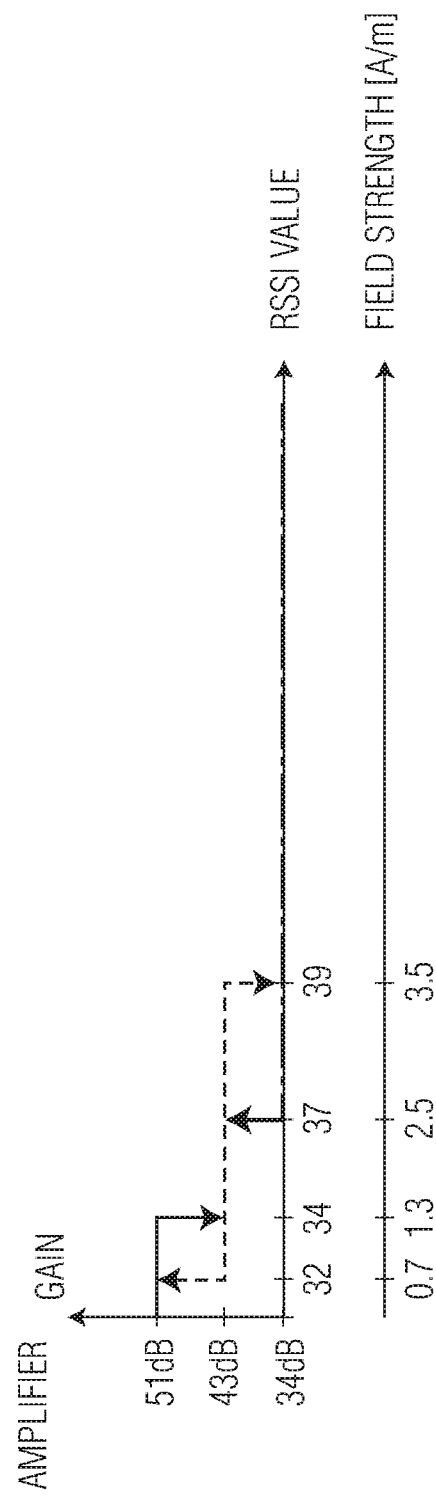
FIG. 4 depicts an example BBA gain switching operation of the amplifier control device depicted in FIG. 1.

FIG. 4 depicts an example amplifier gain switching operation of the amplifier control device 108 of the communications device 100 depicted in FIG. 1. In the example depicted in FIG. 4, the amplifier control device sets the amplifier gain to 34 dB, 43 dB, or 51 dB. However, the gain of the amplifier 106 is not limited 34 dB, 43 dB, and 51 dB and can be set to any appropriate value.

In the example depicted in FIG. 3, the RSSI value has a non-linear relationship with the RF signal strength, which is expressed as the amplitude of the RF signal. Specifically, RSSI values 32, 34, 37, and 39 correspond to RF signal amplitude of 0.7, 1.3, 2.5, and 3.5, respectively. The amplifier control device switches the amplifier gain between 34 dB, 43 dB, or 51 dB based on the current RSSI value and a previous RSSI value. Specifically, when the RSSI value changes from 32 to 34, the amplifier control device switches the amplifier gain from 51 dB to 43 dB, and when the RSSI value changes from 37 to 39, the amplifier control device switches the amplifier gain from 43 dB to 34 dB. In addition, when the RSSI value changes from 39 to 37, the amplifier control device switches the amplifier gain from 39 dB to 37 dB, and when the RSSI value changes from 34 to 32, the amplifier control device switches the amplifier gain from 43 dB to 51 dB. When the RSSI value is below 32, the amplifier control device keeps the BBA gain at 51 dB. When the RSSI value is above 39, the amplifier control device keeps the amplifier gain at 34 dB. When the RSSI value is between 34 and 37, the amplifier control device keeps the amplifier gain at 43 dB.

Figure 5:
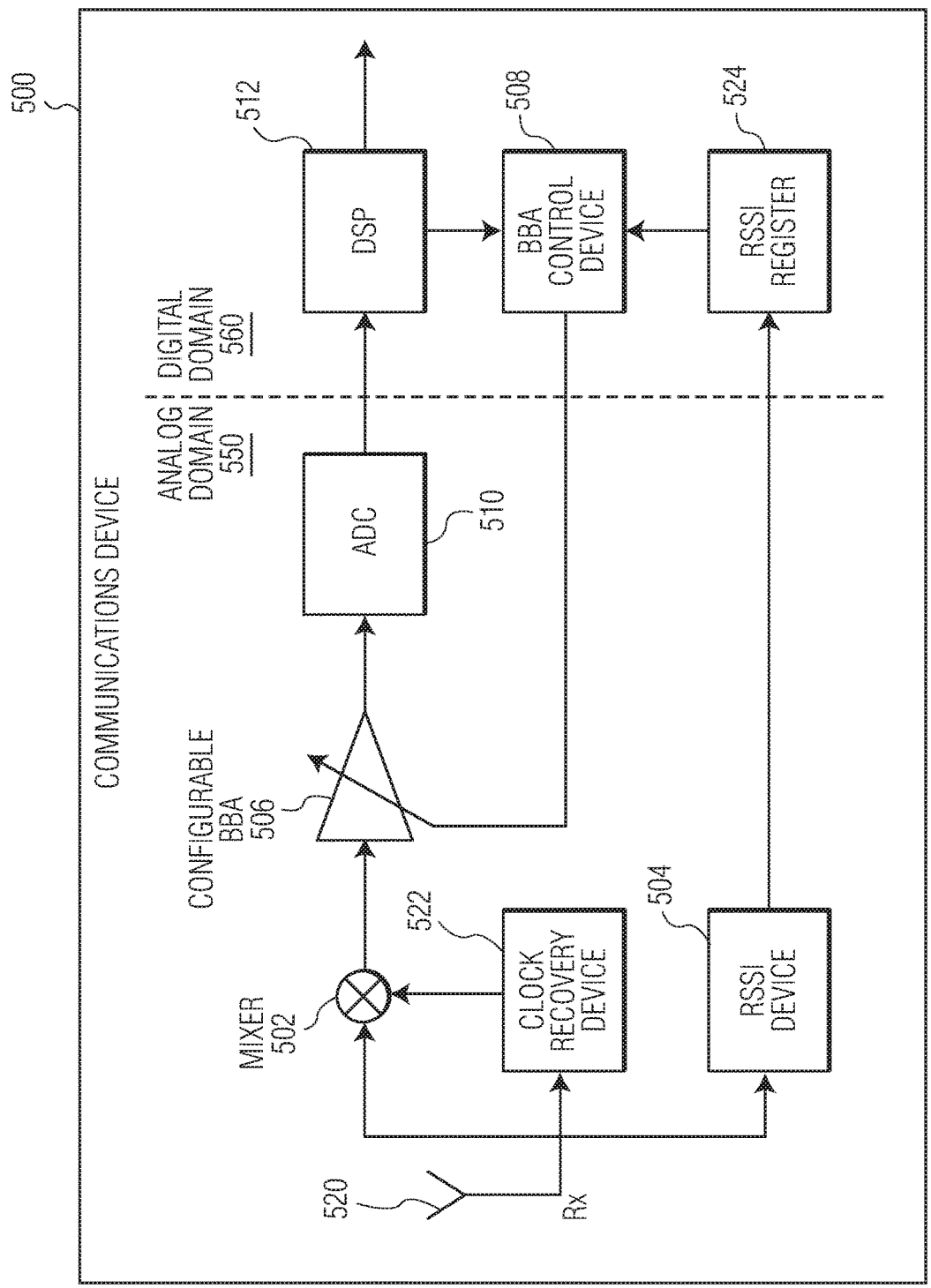
FIG. 5 depicts an embodiment of the communications device depicted in FIG. 1.

In some embodiments, the RF signal received at the communications device 100 is directly supplied to both the band converter 102 and to the RSSI device 104. FIG. 5 depicts such an embodiment of the communications device 100 depicted in FIG. 1. In the embodiment depicted in FIG. 5, a communications device 500 includes an antenna 520, a baseband mixer 502, a clock recovery device 522, an RSSI device 504, a configurable baseband amplifier (BBA) 506, an RSSI register 524, a BBA control device 508, an ADC 510, and a DSP device 512. The communications device is configured to process an RF signal, "Rx," to generate a digital signal. As shown in FIG. 5, the baseband mixer, the clock recovery device, the RSSI device, the configurable BBA, and the ADC are in the analog domain 550 and work with analog signals. The RSSI register, the BBA control device, and the DSP device are in the digital domain 560 and work with digital signals. The communications device 500 depicted in FIG. 5 is one possible embodiment of the communications device 100 depicted in FIG. 1. However, the communications device 100 depicted in FIG. 1 is not limited to the embodiment shown in FIG. 5.

The antenna 520 is configured to receive the RF signal, Rx. The clock recovery device 522 is configured to extract clock information from the RF signal, Rx, which can be used by the mixer 502 to convert the RF signal, Rx, into a baseband signal. The RSSI register 524 is configured to store RSSI values received from the RSSI device 504 and to supply stored RSSI values to the BBA control device 508. The baseband mixer 502, the RSSI device 504, the configurable BBA 506, the BBA control device, the ADC 510, and the DSP device 512 of the communications device 500 depicted in FIG. 5 may be the same as or similar to the baseband converter 102, the RSSI device 104, the BBA 106, the amplifier control device 108, the ADC 110, and the DSP device 112 of the communications device 100 depicted in FIG. 1, respectively.

Figure 6:
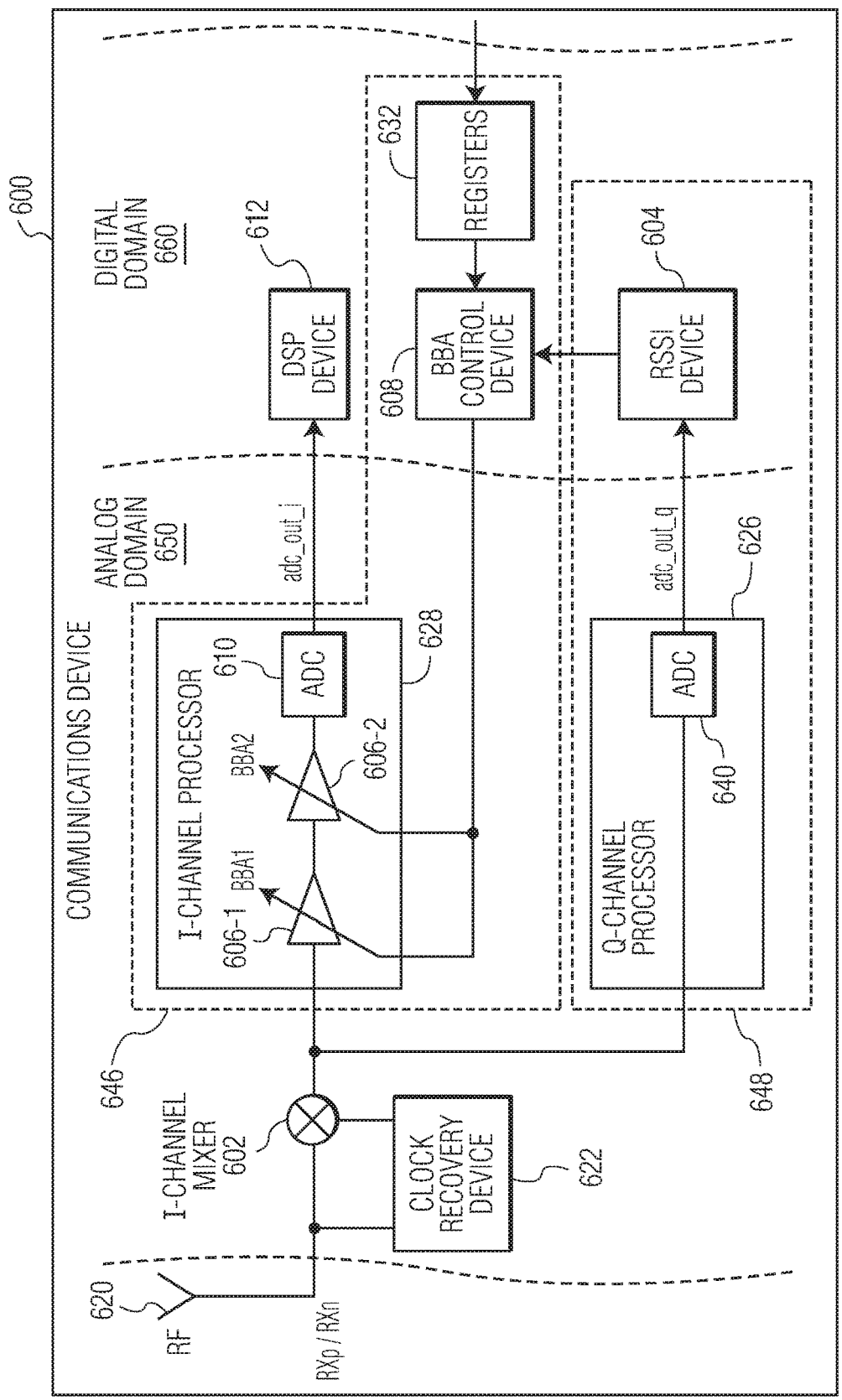
FIG. 6 depicts another embodiment of the communications device depicted in FIG. 1.

In some embodiments, the RF signal received at the communications device 100 is processed by the band converter 102 and the processed RF signal is supplied to the RSSI device 104. FIG. 6 depicts such an embodiment of the communications device 100 depicted in FIG. 1. In the embodiment depicted in FIG. 6, a communications device 600 includes an antenna 620, a baseband in-phase channel (I-channel) mixer 602, an RSSI device 604, a BBA control device 608, a DSP device 612, a clock recovery device 622, a quadrature channel (Q-channel) processor 626 having an ADC 640, an I-channel processor 628, and registers 632 that are used to store firmware configuration for the BBA control device. The I-channel processor includes a first BBA 606-1, a second BBA 606-2, and an ADC 610. The I-channel processor, the BBA control device, and the registers may form a signal amplification system 646 while the Q-channel processor and the RSSI device may form an RSSI system 648. The communications device is configured to process an RF signal, "RXp/RXn", to generate a digital signal. As shown in FIG. 6, the baseband I-channel mixer, the clock recovery device, the first and second BBAs, and the ADC are in the analog domain 650 and work with analog signals. The RSSI device, the BBA control device, the registers, and the DSP device are in the digital domain 660 and work with digital signals. The communications device 600 depicted in FIG. 6 is one possible embodiment of the communications device 100 depicted in FIG. 1. However, the communications device 100 depicted in FIG. 1 is not limited to the embodiment shown in FIG. 6.

The antenna 620 is configured to receive the RF signal, RXp/RXn. The clock recovery device 622 is configured to extract clock information from the RF signal, RXp/RXn, which can be used by the I-channel mixer 602 to convert the in-phase component of the RF signal, Rx, into a baseband signal. In an operation of the communications device 600, the I-channel processor processes the signal from the I-channel mixer into a digital signal, "adc_out_i," which is subsequently processed by the DSP device 612. In particular, the BBA 606-1 and the BBA 606-2 amplify the signal from the I-channel mixer and the ADC 610 converts the amplified signal from the BBA 606-2 into the digital signal, adc_out_i. The Q-channel processor 626, in particular, the ADC 640, converts the signal from the I-channel mixer into a digital signal, "adc_out_q," and the RSSI device 604 obtains an RSSI value based on a DC value of a down-converted version of the RF signal, RXp/RXn. The RSSI device 604, the BBAs 606-1, 606-2, the BBA control device 608, the ADC 610, and the DSP device 612 of the communications device 600 depicted in FIG. 6 may be the same as or similar to the RSSI device 104, the amplifier 106, the amplifier control device 108, the ADC 110, and the DSP device 112 of the communications device 100 depicted in FIG. 1, respectively.

In some embodiments, the amplifier control device 108 minimizes amplifier gain (e.g., BBA gain) switching during reception by freezing the amplifier gain as soon as incoming data reception at the communications device 100 is detected. The amplifier control device can detect the ongoing data reception and freeze the amplifier gain to disable amplifier gain switching. Consequently, using amplifier gain freezing, the number of communication disruptions introduced by amplifier switching is reduced, even in a dynamic environment in which the communications device continuously moves.

Figure 7:
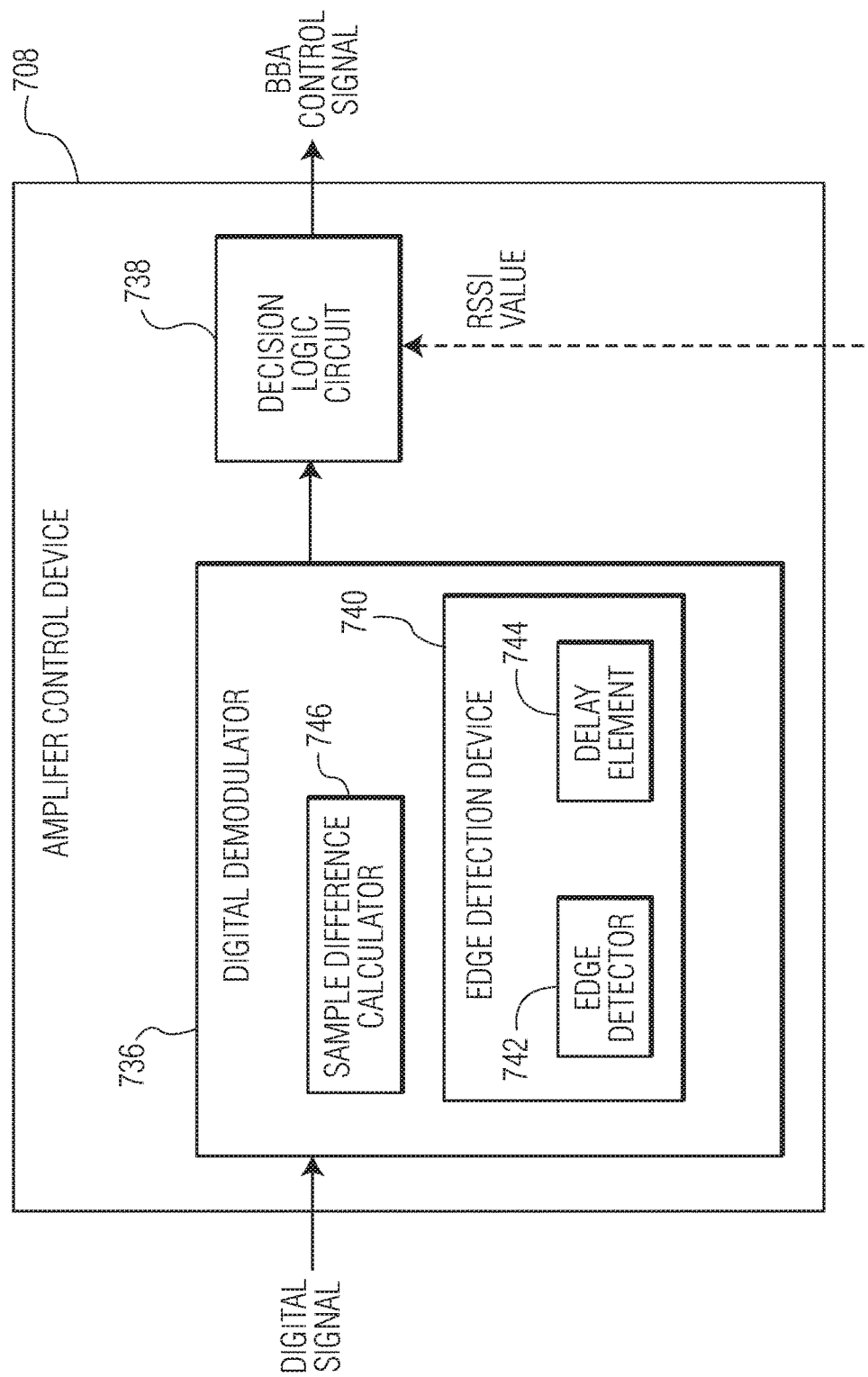
FIG. 7 depicts an embodiment of the amplifier control device depicted in FIG. 1 that implements a BBA gain freezing mechanism.

FIG. 7 depicts an embodiment of the amplifier control device 108 of the communications device 100 depicted in FIG. 1 that implements an amplifier gain freezing mechanism. In the embodiment depicted in FIG. 7, an amplifier control device 708 includes a digital demodulator 736 and a decision logic circuit 738. The amplifier control device 708 depicted in FIG. 7 is one possible embodiment of the amplifier control device 108 depicted in FIG. 1. However, the amplifier control device 108 depicted in FIG. 1 is not limited to the embodiment shown in FIG. 7.

The digital demodulator 736 is configured to demodulate a digital signal that is derived from the RF signal received at the communications device 100. In some embodiments, the digital signal is the output signal, adc_out_q, of the Q-channel ADC 640 depicted in FIG. 6. The digital demodulator may generate multiple signals that are set to predetermined values after a change of value of the digital signal (e.g., an edge of the digital signal) is detected.

The decision logic circuit 738 is configured to generate an amplifier control signal for the amplifier 106 based on inputs from digital demodulator 736 and/or the RSSI value from the RSSI device 104. In some embodiments, the decision logic circuit decides whether or not to freeze the amplifier gain for the amplifier based on inputs from the digital demodulator and/or the RSSI value from the RSSI device.

In some embodiments, the digital demodulator 736 checks for a data reception at the communications device 100 and the decision logic circuit 738 freezes the gain of the amplifier 106 if the data reception is detected. The decision logic circuit may switch the gain of the amplifier between multiple predefined gain values if no data reception is detected. In some embodiments, the digital demodulator demodulates a digital signal that is derived from an RF signal received at the communications device 100 and the decision logic circuit checks for the data reception at the communications device based on a result of demodulating the digital signal. In an embodiment, the digital demodulator generates a first signal with a fixed delay from an edge of the digital signal and a second signal that represents differences between consecutive samples of the digital signal. In an embodiment, the digital demodulator calculates sample differences between the consecutive samples and normalizes the sample differences to generate the second signal. For example, the consecutive samples include a first set of two consecutive samples and a second set of two consecutive samples. The digital demodulator may calculate a difference between a sum of the first set of two consecutive samples and a sum of the second set of two consecutive samples. In some embodiments, the digital demodulator detects a first edge of the second signal and a second edge of the first signal in a time duration that the second signal has a particular state. In these embodiments, the decision logic circuit freezes the gain of the amplifier in response to detecting the second edge of the first signal in the time duration that the second signal has the particular state. The decision logic circuit may compare an RSSI value of an RF signal received at the communications device with a threshold and switch the gain of the amplifier if the RSSI value is larger than or smaller than the threshold.

In the embodiment depicted in FIG. 7, the digital demodulator 736 may include an edge detection device 740, which includes an edge detector 742 and a delay element 744. Although the delay element is shown in FIG. 7 as being separated from the edge detector, in some embodiments, the delay element may be included in the edge detector. The edge detection device may be configured to generate a signal, "demodulator_active_i," with a fixed delay as the edge of the digital signal (e.g., the output signal, adc_out_q, of the Q-channel ADC) is detected. For example, compared to the digital signal, the signal, "demodulator_active_i," is delayed around 6.5 us due to the processing delay caused by, such as, signal filtering.

In order to speed up the detection of an edge of the digital signal, the digital demodulator 736 may generate another signal, "modulation_detected," which has less delay compared to the signal, "demodulator_active_i." However, compared to the signal, "demodulator_active_i," the signal, "modulation_detected," is less reliable because it may have pulses. Nevertheless, when the signal, "modulation_detected," is used to freeze the amplifier gain (e.g., BBA gain), in the worst case, the update of the amplifier gain is performed a bit later, i.e., after the pulses of the signal, "modulation_detected." Generally, the signal, "modulation_detected," is set for a fixed period of time, for example, at least 9.44 us. The pulse of the signal, "modulation_detected," can be cleared when the signal, "modulation_detected," does not last for 9.44 us.

In some embodiments, the digital demodulator 736 includes a sample difference calculator 746 configured to calculate sample differences between two or more consecutive samples and normalize the sample differences to generate the signal, "modulation_detected." In an embodiment, the sample difference calculator calculates sample differences between two sets of two consecutive samples, x[n−3] and x[n−2] and x[n−1] and x[n]. For example, the sample differences between two sets of two consecutive samples can be expressed as:

$$y[n] = -x[n] - x[n-1] + x[n-2] + x[n-3], \quad (1)$$

where n is a positive integer that is equal to or larger than 3, y[n] represents the sample signal difference, and x[n] represents a digital signal that is derived from the RF signal received at the communications device 100 (e.g., the output signal, adc_out_q, of the Q-channel ADC depicted in FIG. 6). When the digital signal does not change for a period of time, the consecutive samples, x[n−3], x[n−2], x[n−1], and x[n] of the digital signal are identical to each other. Consequently, the difference between two sets of two consecutive samples, x[n−3] and x[n−2] and x[n−1] and x[n] is 0 and the signal, "modulation_detected," is at 0. However, when the digital signal begins to change (e.g., from 1 to 0), the sample x[n] may be 0 while the consecutive samples x[n−3], x[n−2] and x[n−1] may be 1 and the signal, "modulation_detected," changes from 0 to 1. Consequently, the difference between two sets of two consecutive samples, x[n−3] and x[n−2] and x[n−1] and x[n] is 1 and. Subsequently, when N increases by 1, the samples x[n] and x[n−1] may be 0 while the samples x[n−3] and x[n−2] may be 1. Consequently, the difference between two sets of two consecutive samples, x[n−3] and x[n−2] and x[n−1] and x[n] is 2 and the normalized sample differences is 1 such that the signal, "modulation_detected," stays at 1. Subsequently, when N increases by 1, the samples x[n], x[n−1] and x[n−2] may be 0 while the sample x[n−3] may be 1. Consequently, the difference between two sets of two consecutive samples, x[n−3] and x[n−2] and x[n−1] and x[n] is 1 and the signal, "modulation_detected," stays at 1. Subsequently, when N increases by 1, the samples x[n], x[n−1], x[n−2] and x[n−3] may be 0. Consequently, the difference between two sets of two consecutive samples, x[n−3] and x[n−2] and x[n−1] and x[n] is 0 and the signal, "modulation_detected," changes from 1 to 0.

Figure 8:
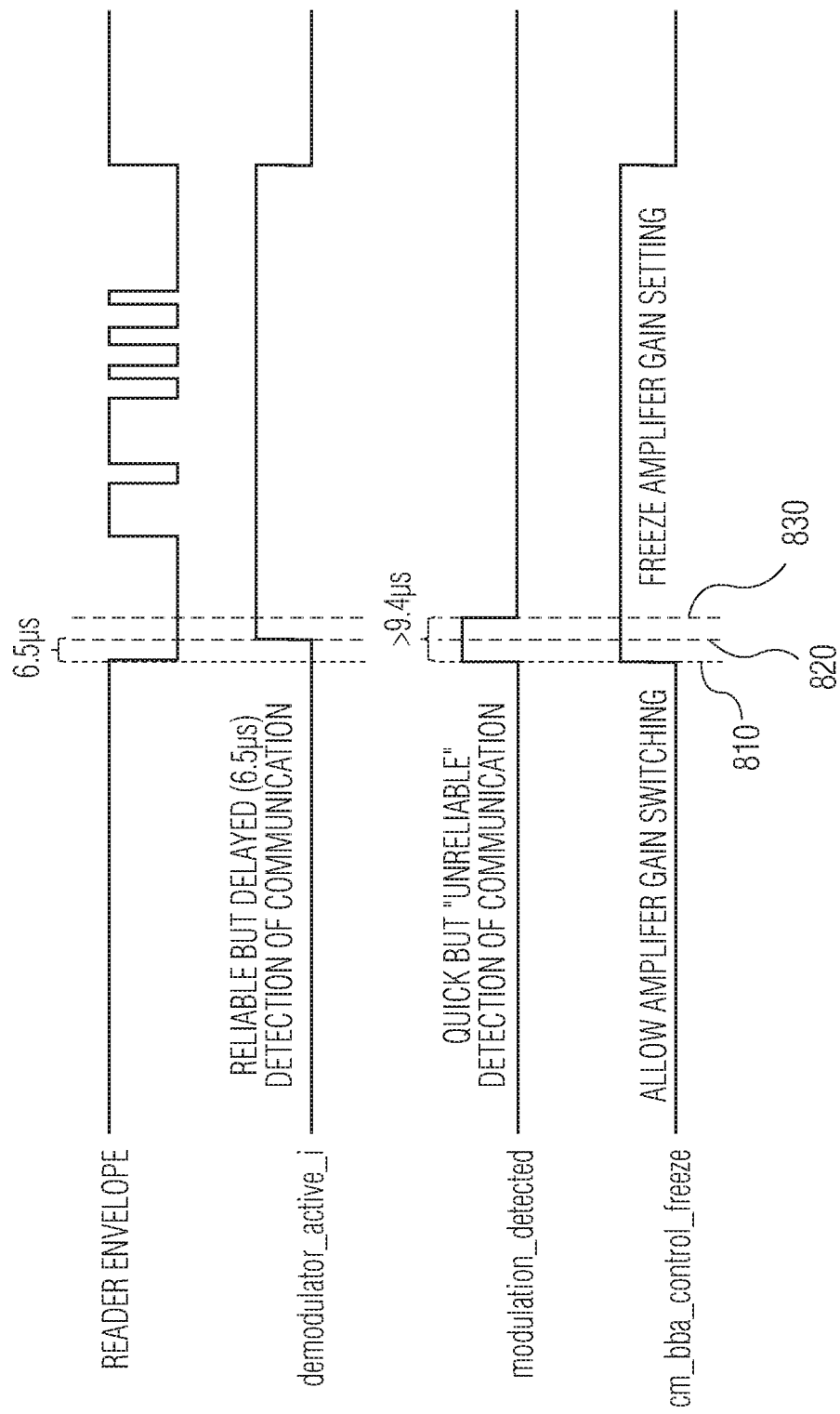
FIG. 8 illustrates a signal timing diagram of the amplifier control device depicted in FIG. 7.

FIG. 8 illustrates a signal timing diagram of the amplifier control device 708 depicted in FIG. 7. In the signal timing diagram depicted in FIG. 8, the amplifier control device uses the signal, "demodulator_active_i," and the signal, "modulation_detected," to generate an amplifier gain (e.g., BBA gain) control signal, "cm_bba_control_freeze," which allows a change in the amplifier gain or prevents the amplifier gain from changing (i.e., freezes the amplifier gain). The signal, "demodulator_active_i," is more reliable than the signal, "modulation_detected." However, compared to a reader envelope signal, the signal, "demodulator_active_i," is delayed by roughly 6.5 us. The signal, "modulation_detected," which is set for at least 9.44 us to overcome the delay of the signal, "demodulator_active_i"), changes with the reader envelope signal. The change of the reader envelope signal from one to zero at time point 810 causes the signal, "modulation_detected," to changes from zero to one at time point 810, which in turn causes the amplifier gain control signal, "cm_bba_control_freeze," to change from zero to 1 (i.e., from allowing amplifier gain change to freezing the amplifier gain). Because the duration of the high state of the signal, "modulation_detected," (between time point 810 and time point 830) is longer than the delay for the signal, "demodulator_active_i," to switch from zero to one (between time point 810 and time point 820), the amplifier control device keeps the amplifier gain control signal, "cm_bba_control_freeze," high for the duration of the high state of the signal, "demodulator_active_i."

Figure 9:
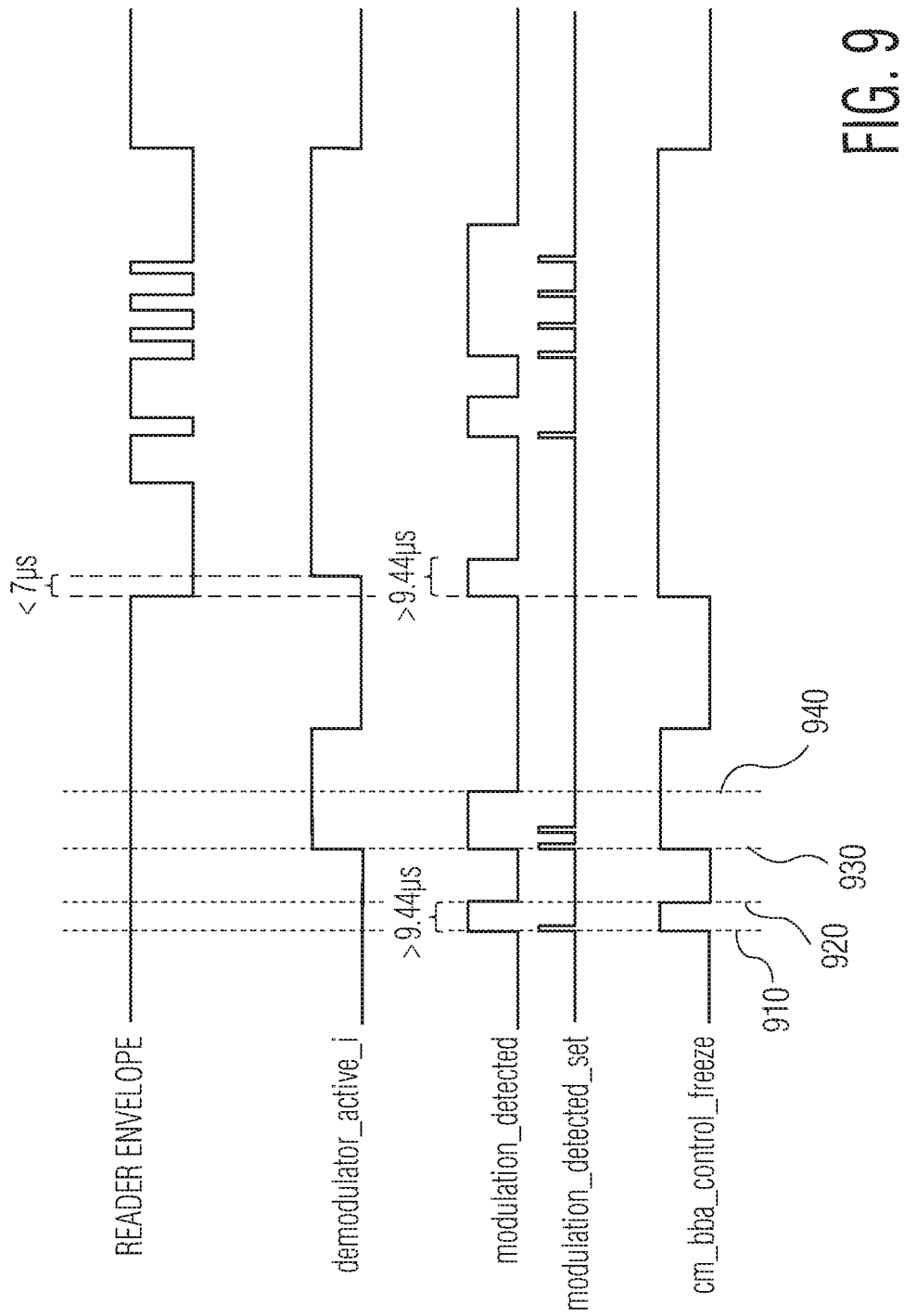
FIG. 9 illustrates a signal timing diagram with false frame detection of the amplifier control device depicted in FIG. 7.

FIG. 9 illustrates a signal timing diagram with false frame detection of the amplifier control device 708 depicted in FIG. 7. In the signal timing diagram depicted in FIG. 9, the amplifier control device uses the signal, "demodulator_active_i," the signal, "modulation_detected," and a signal, "modulation_detected_set," to generate the amplifier gain control signal, "cm_bba_control_freeze." The signal, "modulation_detected_set," is a pulse signal that is generated by the sample difference calculator 746 in response to an edge of the signal, "modulation_detected." The first false frame detection occurs when the signal, "modulation_detected," changes from 0 to 1 at time point 910 while the reader envelope signal stays at 1. However, the signal, "demodulator_active_i," stays at 0 for the duration that the signal, "modulation_detected," stays at 1 (between time point 910 and time point 920). Consequently, the amplifier gain control signal, "cm_bba_control_freeze," stays at 1 (i.e., freezing the amplifier gain) for the duration that the signal, "modulation_detected," stays at 1 and changes to 0 after the signal, "modulation_detected," changes from 1 to 0 at time point 920. The second false frame detection occurs when the signal, "modulation_detected," changes from 0 to 1 at time point 930 while the reader envelope signal stays at 1. The signal, "demodulator_active_i," stays at 1 for the duration that the signal, "modulation_detected," stays at 1 (between time point 930 and time point 940) while there is no delay between the signal, "demodulator_active_i," and the signal, "modulation_detected." Consequently, the amplifier gain control signal, "cm_bba_control_freeze," stays at 1 (i.e., freezing the amplifier gain) for the duration that the signal, "modulation_detected," stays at 1 and changes to 0 after the signal, "demodulator_active_i," changes from 1 to 0 at time point 940.

Figure 10:
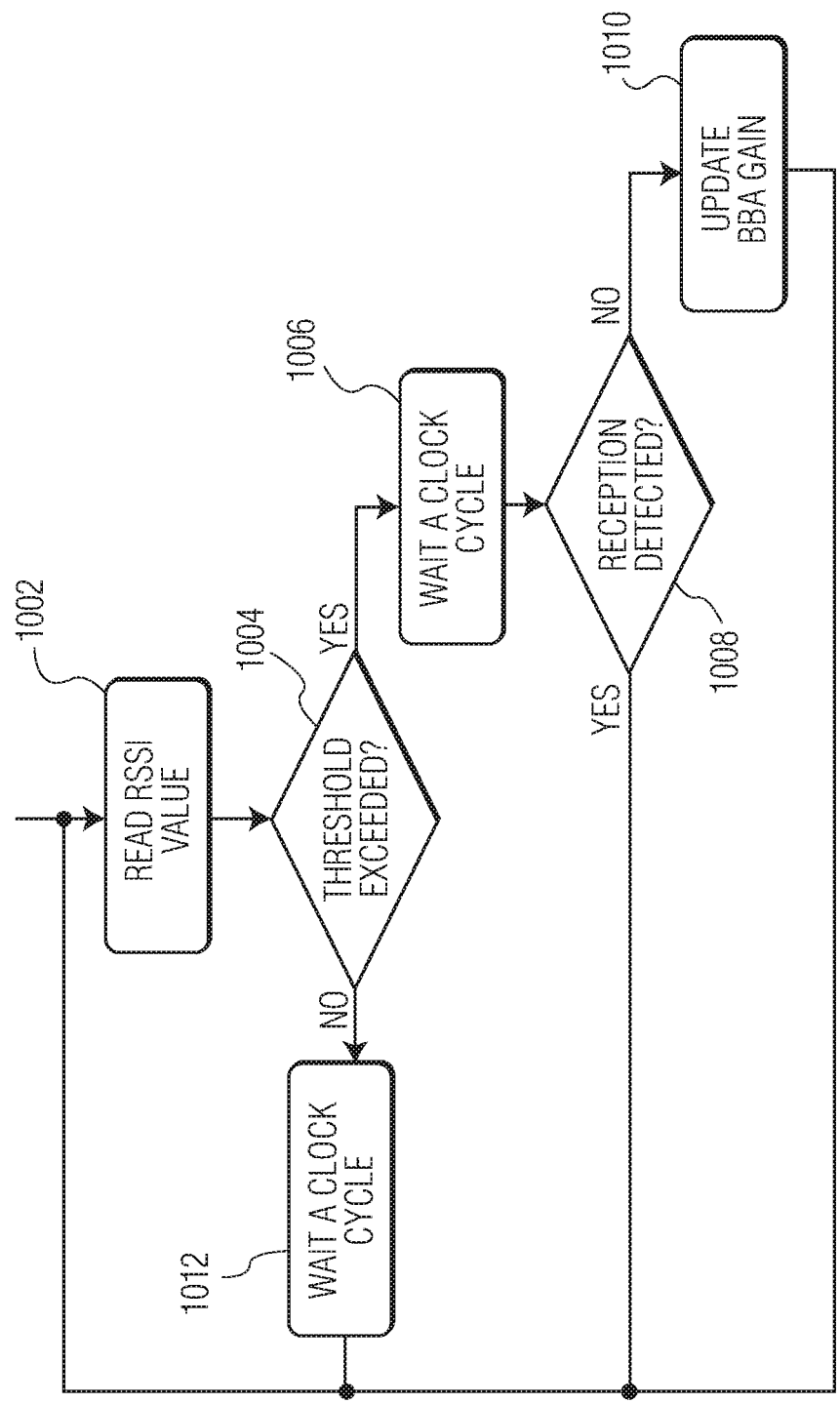
FIG. 10 is a flow chart that illustrates an exemplary operation of the amplifier control device depicted in FIG. 7.

FIG. 10 is a flow chart that illustrates an exemplary operation of the amplifier control device 708 depicted in FIG. 7. In the exemplary operation of the amplifier control device, a delay mechanism is implemented to detect data frame reception before amplifier gain switching and to avoid the amplifier gain switching caused by an incoming data frame. At step 1002, the RSSI value is read into the amplifier control device. At step 1004, the RSSI value is compared to a predetermined threshold.

If the RSSI value exceeds the predetermined threshold, the amplifier control device 708 waits for a clock cycle in order to allow for reception detection and to avoid amplifier switching caused by voltage drop due to signal demodulation at step 1006. At step 1004, the amplifier control device checks for whether or not a data reception at the communications device 100 is detected. If no data reception is detected, the amplifier gain is updated at step 1010. If data reception is detected, the amplifier control device continues to read the RSSI value at step 1002.

If the RSSI value does not exceed the predetermined threshold, the amplifier control device 708 waits for a clock cycle at step 1012 and continues to read the RSSI value at step 1002.

Figure 11:
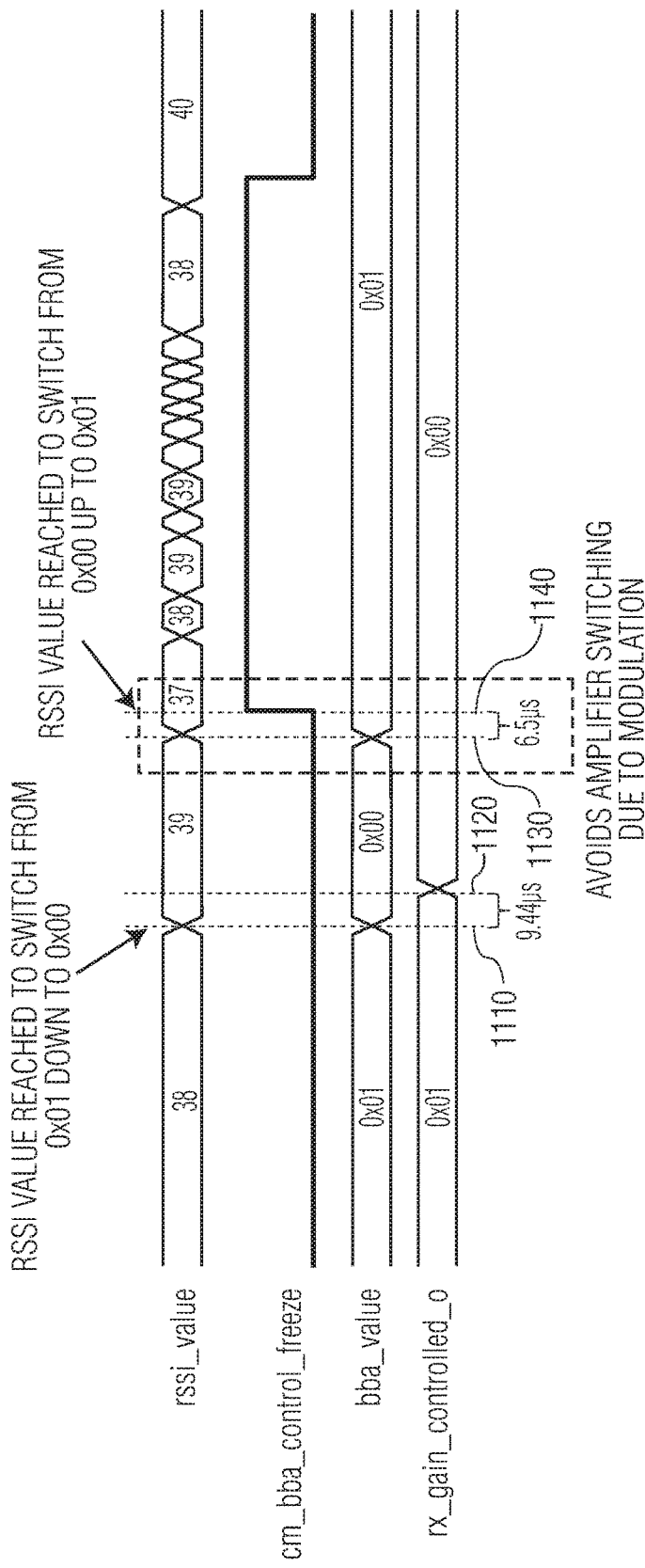
FIG. 11 illustrates a signal timing diagram of the amplifier control device depicted in FIG. 7 that describes a delay mechanism.

FIG. 11 illustrates a signal timing diagram of the amplifier control device 708 depicted in FIG. 7 that describes a delay mechanism. In the signal timing diagram depicted in FIG. 11, at time point 1110, the RSSI value changes from 0x01 to 0x00, and simultaneously the amplifier gain value, "bba_value," changes from 0x00 to 0x01. After the amplifier gain change, the amplifier control device monitors the amplifier gain control signal, "cm_bba_control_freeze," for a period of time (e.g., 9.44 µs) and determines that the amplifier gain control signal, "cm_bba_control_freeze," is at 0 (allowing amplifier gain change) during the period of time. Consequently, the amplifier control device sends a signal, "rx_gain_controlled_o," to the amplifier 106 at time point 1120, to increase the amplifier gain. At time point 1130, the RSSI value changes from 0x00 to 0x01, and simultaneously the amplifier gain value, "bba_value," changes from 0x01 to 0x00. After the amplifier gain change, the amplifier control device monitors the amplifier gain control signal, "cm_bba_control_freeze," for a period of time (e.g., 9.44 µs) and determines that the amplifier gain control signal, "cm_bba_control_freeze," switches from 0 to 1 (freezing amplifier gain) during the period of time. Consequently, the amplifier control device sends a signal, "rx_gain_controlled_o," to the amplifier 106 at time point 1140, to maintain the amplifier gain.

Figure 12:
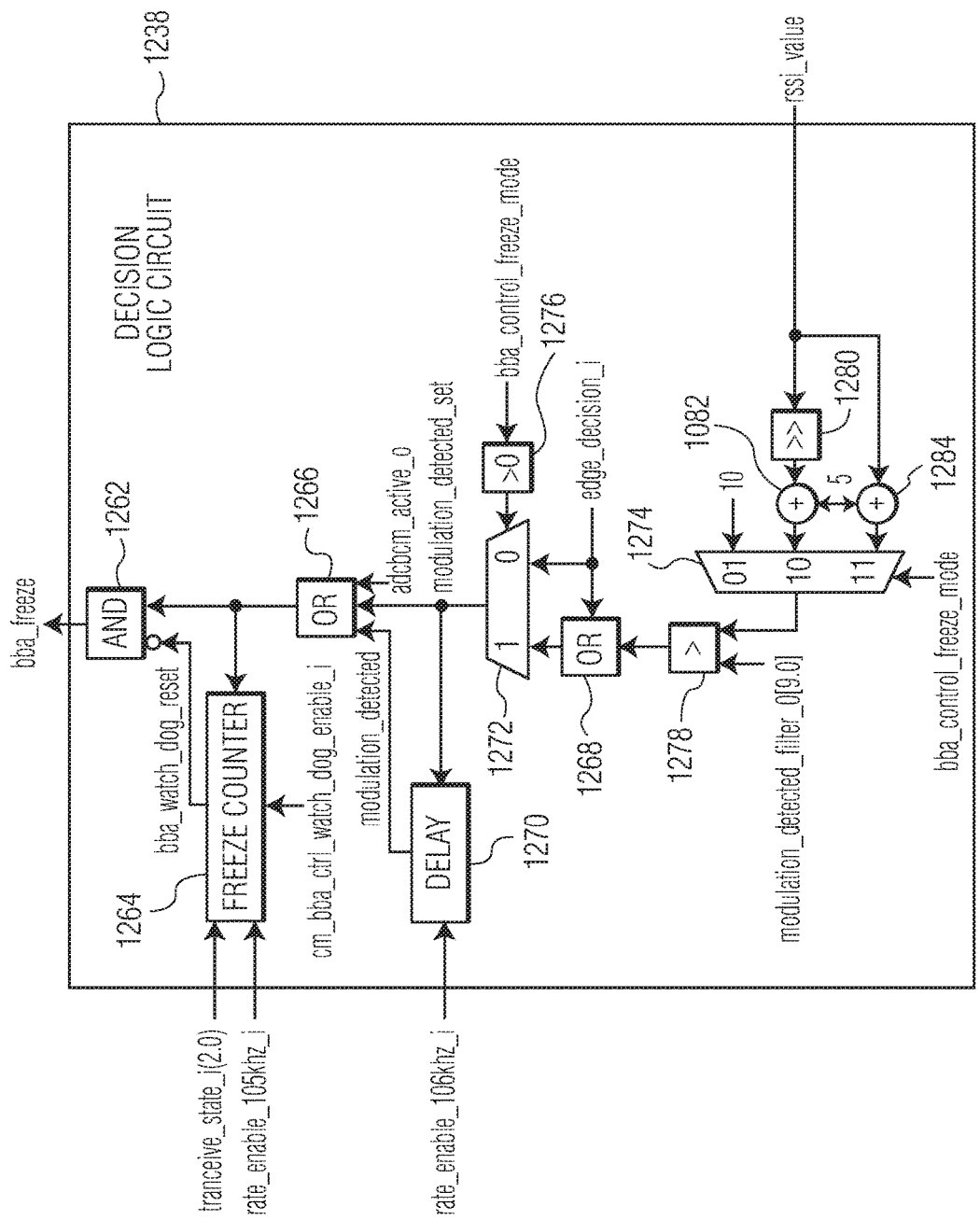
FIG. 12 depicts an embodiment of a decision logic circuit of the amplifier control device depicted in FIG. 7.

FIG. 12 depicts an embodiment of the decision logic circuit 738 of the amplifier control device 708 depicted in FIG. 7. In the embodiment depicted in FIG. 12, a decision logic circuit 1238 includes an AND logic circuit 1262 with an inverted input, a freeze counter 1264, two OR logic circuits 1266, 1268, a delay element 1270, multiplexers 1272, 1274, comparators 1276, 1278, a bit shifter 1280, and two adder circuits 1282, 1284. The decision logic circuit 1238 depicted in FIG. 7 is one possible embodiment of the decision logic circuit 738 depicted in FIG. 7. However, the decision logic circuit 738 depicted in FIG. 7 is not limited to the embodiment shown in FIG. 12.

The decision logic circuit 1238 depicted in FIG. 12 has two choices for the amplifier gain freezing mechanism based on a configuration signal, "bba_control_freeze_mode," of the amplifier control device 708. If the configuration signal, "bba_control_freeze_mode," is equal to zero, the decision logic circuit uses only the edge decision signal to decide whether or not to freeze the amplifier gain. If the configuration signal, "bba_control_freeze_mode," is larger than zero, the decision logic circuit uses only the edge decision signal or the signal, "modulation_detected_filter," to decide whether or not to freeze the amplifier gain. In a first scenario, the multiplexer 1274 uses a static threshold (e.g., 10). In a second scenario, the multiplexer 1274 uses an RSSI dependent threshold (e.g., 5+½*RRSI value) generated by the adder 1282 and the bit shifter 1280. In a third scenario, the multiplexer 1274 uses an RSSI dependent threshold (e.g., 5+RSSI) value generated by the adder 1284. The comparator 1278 compares the signal, "modulation_detected_filter," with the result of the multiplexer. The OR logic circuit 1268 performs an OR operation on the result of the comparator 1278 and the edge decision signal. The multiplexer 1272 outputs the edge decision signal if the configuration signal, "bba_control_freeze_mode," is equal to zero and outputs the result of the OR logic circuit if the configuration signal, "bba_control_freeze_mode," is equal to one. The delay element 1270 is used to delay the signal, "rate_enable_106 khz_i," based on the output signal, "modulation_detected_set," of the multiplexer 1272 to generate a signal, "modulation_detected." The output signal, "modulation_detected," of the delay element 1270, the output signal, "modulation_detected_set," of the multiplexer 1272 and the signal, "demodulation_active_i," are input into the OR logic circuit 1266. The output of the OR logic circuit 1266 is input into the freeze counter 1264 and to the AND logic circuit 1262 with an inverted input. The freeze counter 1264 generates a amplifier watchdog reset signal, "bba_watch_dog_reset," based on the signal, "rate_enable_106 khz_i," the signal, "transceive_state_i," the signal, "cm_bba_ctrl_watch_dog_enable_i," and the output of the OR logic circuit 1266. The AND logic circuit 1262 performs an AND operation based on the output of the OR logic circuit 1266 and an inverted version of the amplifier watchdog reset signal, "bba_watch_dog_reset."

Figure 13:
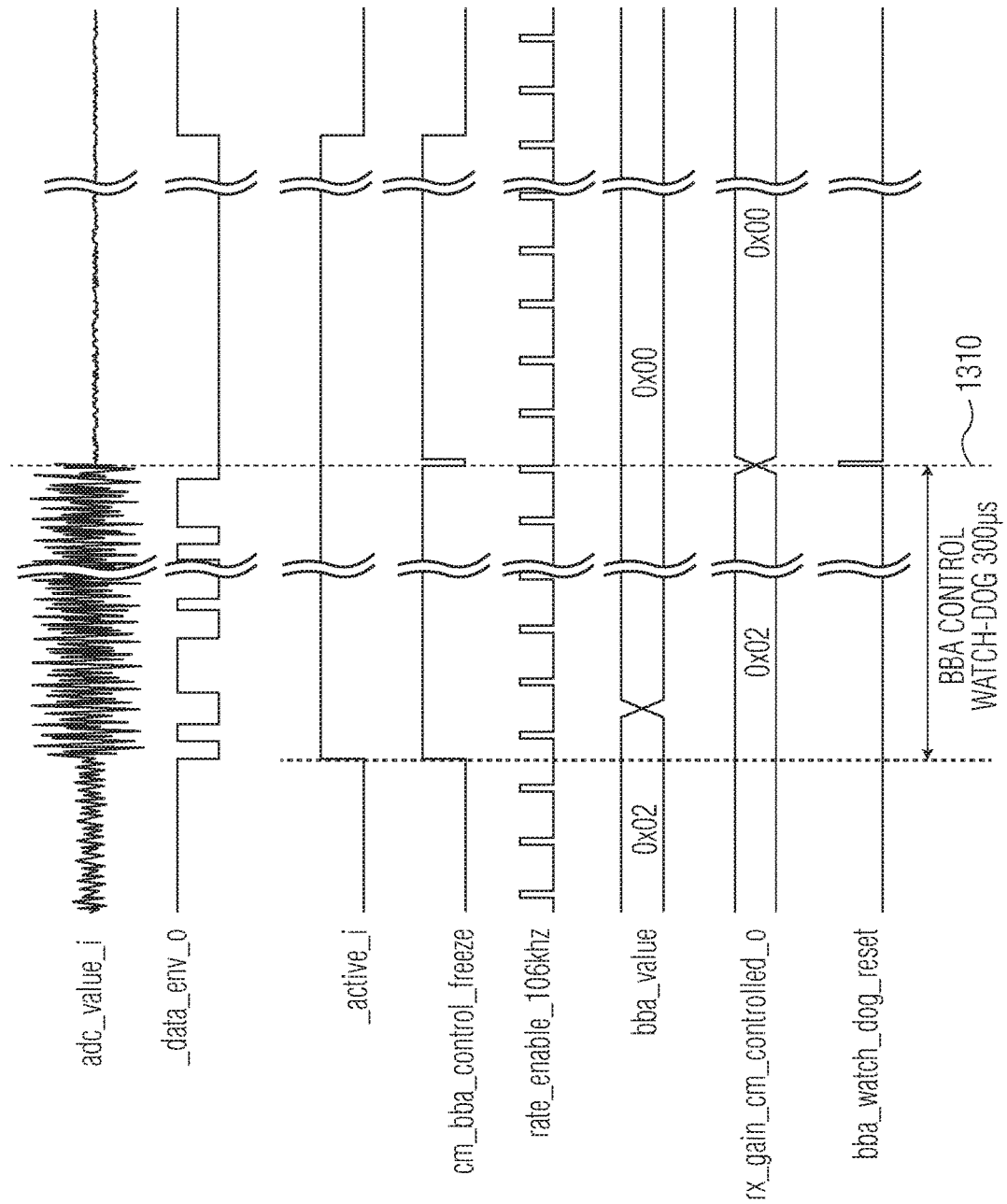
FIG. 13 illustrates a signal timing diagram of the decision logic circuit depicted in FIG. 12.

FIG. 13 illustrates a signal timing diagram of the decision logic circuit 1238 depicted in FIG. 12. In the signal timing diagram depicted in FIG. 13, an amplifier watchdog timer (e.g., a freeze counter depicted in FIG. 12) is implemented to prevent that the amplifier gain remains fixed with a wrong value. In particular, the amplifier watchdog reset signal, "bba_watch_dog_reset," is used to reset the amplifier gain control signal, "cm_bba_control_freeze," after the amplifier gain is frozen for a threshold time period. For example, if the RF signal received at the communications device 100 has a high amplitude, the digital demodulator 736 may constantly detect an envelope, which results in amplifier switching freezing for an extended time period and presents proper data reception. The amplifier watchdog timer counts the number of amplifier gain freezing periods in multiple of 9.44 us cycles (1 bit for 106 kBd). For example, if the amplifier gain is frozen for 31 periods (around 292 μs) and the data receiving state (e.g., the signal, "transceive_state_i,") reflects no ongoing data reception, the amplifier gain is unfrozen for a brief time period (starting at time point 1310). In the time period that the BBA gain is unfrozen, the "signal, "rx_gain_controlled_o," the amplifier gain control signal, "cm_bba_control_freeze," and the amplifier watchdog reset signal, "bba_watch_dog_reset," change at time point 1310 and the amplifier gain is updated.

Figure 14:
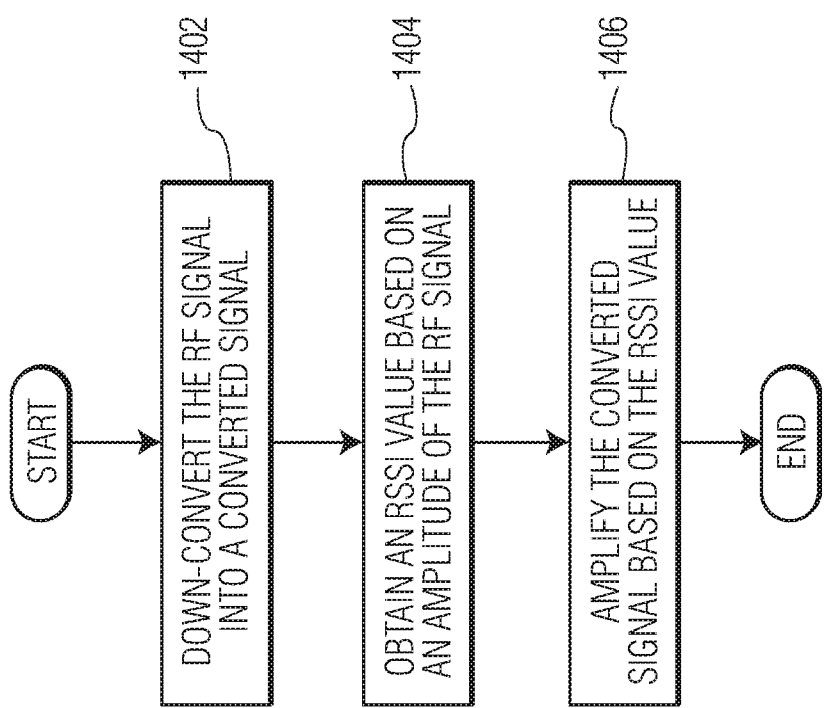
FIG. 14 is a process flow diagram of a method for processing an RF signal in accordance with an embodiment of the invention.

FIG. 14 is a process flow diagram of a method for processing an RF signal in accordance with an embodiment of the invention. At block 1402, the RF signal is down-converted into a converted signal. At block 1404, a received signal strength indicator (RSSI) value is obtained based on an amplitude of the RF signal. At block 1406, the converted signal is amplified based on the RSSI value.

Figure 15:
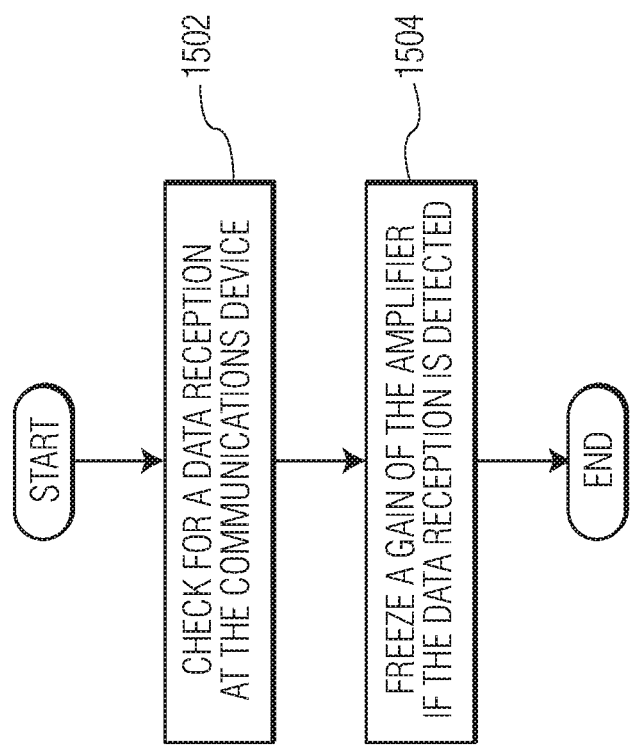
FIG. 15 is a process flow diagram of a method for control an amplifier in accordance with an embodiment of the invention.

FIG. 15 is a process flow diagram of a method for controlling an amplifier of a communications device in accordance with an embodiment of the invention. At block 1502, a data reception at the communications device is checked for. At block 1504, a gain of the amplifier is frozen if the data reception is detected. The communications device may be the same or similar to the communications device 100 depicted in FIG. 1, the communications device 500 depicted in FIG. 5, and/or the communications device 600 depicted in FIG. 6. The amplifier may be the same or similar to the amplifier 106 depicted in FIG. 1, the configurable BBA 506 depicted in FIG. 5, and/or the BBA 606-1 or 606-2 depicted in FIG. 6.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for controlling an amplifier of a communications device, the method comprising:
   checking for a data reception at the communications device; and
   freezing a gain of the amplifier if the data reception is detected by suspending switching the gain of the amplifier during reception of a data frame.

2. The method of claim 1, further comprising switching the gain of the amplifier between a plurality of predefined gain values if no data reception is detected.

3. The method of claim 1, wherein checking for the data reception at the communications device comprises:
   demodulating a digital signal that is derived from a radio frequency (RF) signal received at the communications device; and
   checking for the data reception at the communications device based on a result of demodulating the digital signal.

4. The method of claim 3, wherein demodulating the digital signal comprises:
   generating a first signal with a fixed delay from an edge of the digital signal; and
   generating a second signal that represents differences between a plurality of consecutive samples of the digital signal.

5. The method of claim 4, wherein generating the second signal comprises:
   calculating sample differences between the consecutive samples; and
   normalizing the sample differences to generate the second signal.

6. The method of claim 5, wherein the consecutive samples comprise a first set of two consecutive samples and a second set of two consecutive samples, and wherein calculating the sample differences between the consecutive samples comprises calculating a difference between a sum of the first set of two consecutive samples and a sum of the second set of two consecutive samples.

7. The method of claim 5, wherein checking for the data reception at the communications device comprises:
   detecting a first edge of the second signal; and
   detecting a second edge of the first signal in a time duration that the second signal has a particular state; and
   wherein freezing the gain of the amplifier comprises freezing the gain of the amplifier in response to detecting the second edge of the first signal in the time duration that the second signal has the particular state.

8. The method of claim 2, further comprising comparing a received signal strength indicator (RSSI) value of a radio frequency (RF) signal received at the communications device with a threshold, wherein switching the gain of the amplifier comprises switching the gain of the amplifier if the RSSI value is larger than or smaller than the threshold.

9. The method of claim 8, wherein the RSSI value has a non-linear relationship with an amplitude of the RF signal.

10. The method of claim 8, further comprising obtaining the RSSI value based on an amplitude of a quadrature component of the RF signal.

11. A system for controlling an amplifier of a communications device, the system comprising:
    a data reception detection device configured to check for a data reception at the communications device; and
    a decision logic circuit configured to freeze a gain of the amplifier if the data reception is detected by suspending switching the gain of the amplifier during reception of a data frame.

12. The system of claim 11, wherein the decision logic circuit is further configured to switch the gain of the amplifier between a plurality of predefined gain values if no data reception is detected.

13. The system of claim 11, wherein the data reception detection device comprises a digital demodulator configured to demodulate a digital signal that is derived from a radio frequency (RF) signal received at the communications device, wherein the decision logic circuit is further configured to check for the data reception at the communications device based on a result of demodulating the digital signal.

14. The system of claim 13, wherein the digital demodulator is further configured to:
    generate a first signal with a fixed delay from an edge of the digital signal; and
    generate a second signal that represents differences between a plurality of consecutive samples of the digital signal.

15. The system of claim 14, wherein the digital demodulator is further configured to:
    calculate sample differences between the consecutive samples; and
    normalize the sample differences to generate the second signal.

16. The system of claim 15, wherein the consecutive samples comprise a first set of two consecutive samples and a second set of two consecutive samples, and wherein the digital demodulator is further configured to calculate a difference between a sum of the first set of two consecutive samples and a sum of the second set of two consecutive samples.

17. The system of claim 15, wherein the digital demodulator is further configured to:
    detect a first edge of the second signal; and
    detect a second edge of the first signal in a time duration that the second signal has a particular state, and
    wherein the decision logic circuit is further configured to freeze the gain of the amplifier in response to detecting the second edge of the first signal in the time duration that the second signal has the particular state.

18. The system of claim 12, wherein the decision logic circuit is further configured to:
    compare a received signal strength indicator (RSSI) value of a radio frequency (RF) signal received at the communications device with a threshold; and
    switch the gain of the amplifier if the RSSI value is larger than or smaller than the threshold.

19. The system of claim 18, further comprising an RSSI device configured to obtain the RSSI value based on an amplitude of a quadrature component of the RF signal.

20. A method for controlling an amplifier of a communications device, the method comprising:
    checking for a data reception at the communications device, wherein checking for the data reception at the communications device comprises:
    generating a first signal with a fixed delay from an edge of the digital signal;

generating a second signal that represents differences between a plurality of consecutive samples of the digital signal;

detecting a first edge of the second signal; and detecting a second edge of the first signal in a time duration that the second signal has a particular state; and freezing a gain of the amplifier in response to detecting the second edge of the first signal.

* * * * *